(12) United States Patent
Pingree et al.

(10) Patent No.: US 8,835,743 B2
(45) Date of Patent: Sep. 16, 2014

(54) INTEGRATED THERMOELECTRIC HONEYCOMB CORE

(71) Applicants: Liam S. Cavanaugh Pingree, Seattle, WA (US); Noel T. Gerken, Maple Valley, WA (US)

(72) Inventors: Liam S. Cavanaugh Pingree, Seattle, WA (US); Noel T. Gerken, Maple Valley, WA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 13/914,724

(22) Filed: Jun. 11, 2013

(65) Prior Publication Data
US 2013/0269742 A1     Oct. 17, 2013

Related U.S. Application Data

(62) Division of application No. 12/714,484, filed on Feb. 27, 2010, now Pat. No. 8,487,177.

(51) Int. Cl.
*H01L 35/30* (2006.01)
*H01L 35/28* (2006.01)
*H01L 35/34* (2006.01)
*H01L 35/32* (2006.01)

(52) U.S. Cl.
CPC ............... *H01L 35/30* (2013.01); *H01L 35/32* (2013.01); *H01L 35/34* (2013.01)
USPC ........... 136/205; 136/201; 136/241; 156/197; 156/292

(58) Field of Classification Search
None
See application file for complete search history.

(56) References Cited

U.S. PATENT DOCUMENTS

| | | | |
|---|---|---|---|
| 4,343,960 A * | 8/1982 | Eguchi et al. | 136/225 |
| 5,994,637 A | 11/1999 | Imanishi et al. | |
| 6,005,182 A | 12/1999 | Imanishi et al. | |
| 6,097,088 A | 8/2000 | Sakuragi | |
| 6,306,673 B1 | 10/2001 | Imanishi et al. | |
| 6,440,521 B1 | 8/2002 | Moore | |
| 6,451,406 B1 | 9/2002 | Wang et al. | |
| 6,672,076 B2 | 1/2004 | Bell | |
| 6,958,443 B2 | 10/2005 | Stark et al. | |

(Continued)

FOREIGN PATENT DOCUMENTS

CN    1750287 A    3/2006
EP    0880184 A2   11/1998

OTHER PUBLICATIONS

EPO European Search Report for Counterpart Parent EP Application No. 11156318.5, Jun. 5, 2012, 6 pages.

(Continued)

*Primary Examiner* — Jennifer Michener
*Assistant Examiner* — Matthew Zapadka

(57) ABSTRACT

The disclosure provides a thermoelectric composite sandwich structure with an integrated honeycomb core and method for making. The thermoelectric composite sandwich structure comprises two prepreg composite face sheets and an integrated honeycomb core assembled between the face sheets. The honeycomb core comprises a plurality of core elements bonded together with a core adhesive. Each core element has a first side substantially coated with a negative Seebeck coefficient conductive material having a plurality of first spaced gaps, and each core element further has a second side substantially coated with a positive Seebeck coefficient conductive material having a plurality of second spaced gaps. The honeycomb core further comprises a plurality of electrical connections for connecting in series the first side to the second side. A temperature gradient across the honeycomb core generates power.

20 Claims, 7 Drawing Sheets

(56) References Cited

U.S. PATENT DOCUMENTS

| | | |
|---|---|---|
| 7,985,919 B1 | 7/2011 | Roscheisen et al. |
| 2006/0157101 A1* | 7/2006 | Sakamoto et al. ............ 136/201 |
| 2008/0083447 A1 | 4/2008 | Sienel |
| 2008/0121263 A1* | 5/2008 | Schutte et al. ................ 136/203 |
| 2008/0223426 A1 | 9/2008 | Ohno |
| 2009/0120482 A1 | 5/2009 | McCullough et al. |
| 2009/0250091 A1 | 10/2009 | Huang et al. |
| 2011/0030754 A1 | 2/2011 | Smythe et al. |
| 2011/0244177 A1 | 10/2011 | Nasstrom |

OTHER PUBLICATIONS

USPTO Non-Final Office Action for Parent U.S. Appl. No. 12/714,484, Oct. 12, 2012, 25 pages.

S. Charar et al., "Preparation of Bi2Te3 Films by Hot-Wall Epitaxy and Characterization of p-n. Junction", Phys. Stat. Sol. (a), 2000, 182, pp. 669-678.

E. Koukharenko et al., "Microstructure and Thermoelectric Properties of Thin Foils of Bismuth Telluride Alloys", Mat. Res. Soc. Symp. Proc., vol. 545, 1999, pp. 507-512.

C.B. Satterthwaite et al., "Electrical and Thermal Properties of Bi2Te3", Physical Review, vol. 108, No. 3, Dec. 1, 1957, pp. 1164-1170.

T. Schneider et al., "Thin Film Thermoelectric Power Generation—Enabling Waste Heat Recovery in High Heat Flux Environments", Nextreme Thermal Solutions, May 3, 2007, 25 pages.

J. Weber et al., "Coin-size Coiled-up Polymer Foil Thermoelectric Power Generator for Wearable Electronics", Elsevier B.V., Sensors and Actuators A, 132 (2006) pp. 325-330.

* cited by examiner

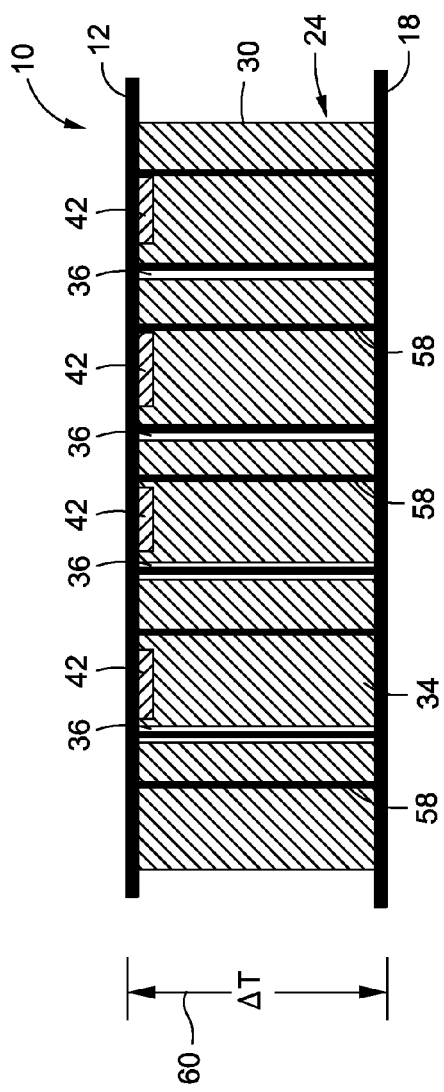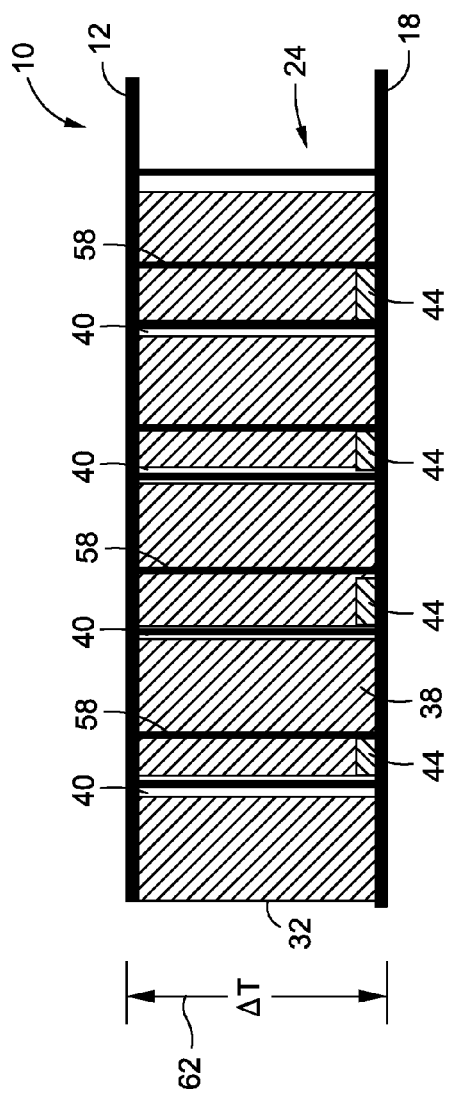

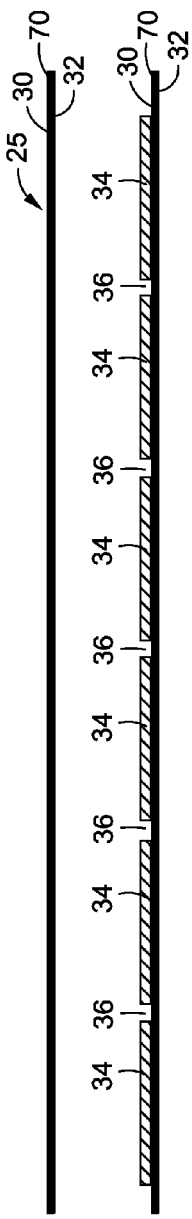
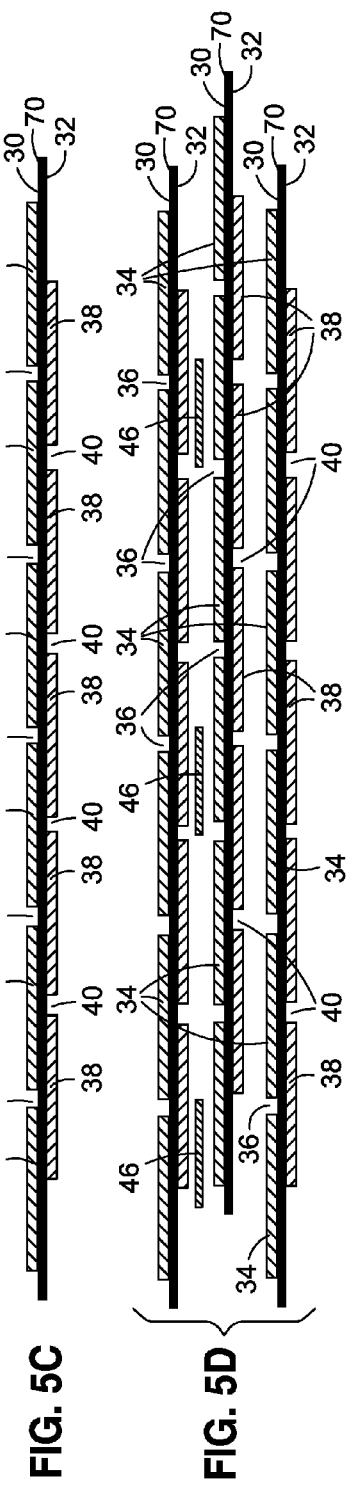
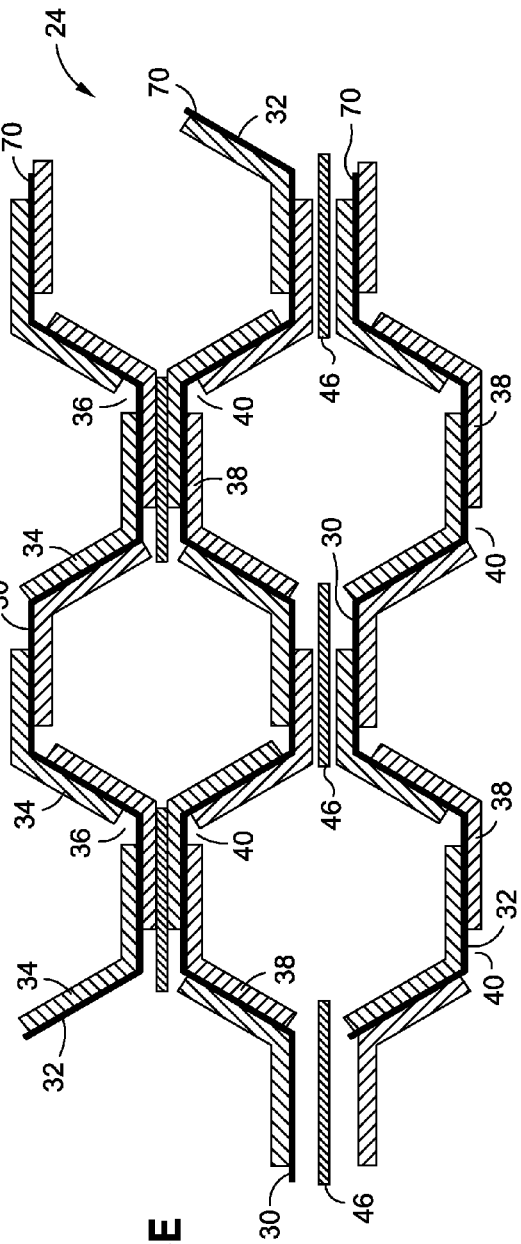
FIG. 5A
FIG. 5B
FIG. 5C
FIG. 5D
FIG. 5E

INTEGRATED THERMOELECTRIC HONEYCOMB CORE

CROSS-REFERENCE TO RELATED APPLICATIONS

The present application is a divisional of and claims priority to pending application Ser. No. 12/714,484, filed Feb. 27, 2010, and entitled INTEGRATED THERMOELECTRIC HONEYCOMB CORE AND METHOD, the entire contents of which is incorporated herein by reference.

BACKGROUND

1) Field of the Disclosure

The disclosure relates generally to devices and systems for generating electrical power, and more particularly, to thermoelectric devices and methods for generating electrical power.

2) Description of Related Art

Small sensors are used in a variety of applications in aircraft, spacecraft, motorcraft, watercraft, and other craft, as well as vehicles and structures. For example, an array of small sensors may be used in structural health monitoring (SHM) to continuously monitor structures, such as composite structures of aircraft, and measure material characteristics and stress and strain levels to assess performance, possible damage, and current state of the structure. A series of small sensors may also be used in aircraft for "fly-by-feel" applications to provide feedback to the flight controls to adjust the flight envelope or to limit loads in the flight pattern. Moreover, small sensors may be used with on-board wireless communication of controls on an aircraft, damage tolerant structures on an aircraft, and redundant power supplies for additional sources of power on an aircraft. The implementation of such small sensors in these applications can require the use of additional power and communication wires which can increase the complexity and costs. Thus, generating power locally, rather than from a central source, for these types of small sensor systems is desirable.

The harvesting of electricity from other forms of energy to drive small and mid-size sensor devices (between 100 milliwatts and 100 watts) is known. For example, solar panels have been used to harvest electricity. However, such solar panels can be costly to make and bulky in size. In addition, known power sources used with remote sensors can include vibration scavengers based on piezoelectric materials, which generate a voltage when deformed, and scavengers based on thermal gradients or thermoelectric junctions, which generate a voltage as a function of temperature. However, these known power sources can be bulky, can add weight, and can be difficult to harvest sufficient energy at a specific location of need.

Thermoelectric based generator devices have been found to be effective when used with aircraft and other craft because there are no moving parts and a thermal gradient is typically present. Thermoelectric devices can convert thermal energy directly into electrical power or electricity. The thermal gradient is applied across two faces of the device, as it is not sufficient to have a gradient across only one face. With thermoelectric devices, the power generated is dependent upon the change in temperature across the device itself.

Known thermoelectric devices and systems include add-on components rather than fully integrated structures. For example, the use of non-integrated thermoelectric based generator devices that may include exterior heat sinks and water cooling to increase the thermal gradients is known. However, such non-integrated thermoelectric based generator devices may not provide sufficient power for an extended period of time and may be heavy, thus increasing the overall weight of an aircraft. Moreover, in applications where locally generated power is required, the thermal gradient accessible to an add-on device is typically only 1% to 2%, resulting in the add-on device having decreased efficiency. For example, with an add-on device, only 1% of a 150° F. ΔT (temperature difference), or upwards of 250° F. ΔT on engine cowlings, or 2° F. ΔT can be used to generate thermoelectric power. This may be improved by adding other heat conducting or cooling materials, but this can result in the addition of significant weight, thus dropping the ratio of generated power per pound of additional weight.

In addition, the use of add-on power sources, such as vibration based energy harvesting units, is also known. However, such vibration based energy harvesting units can add weight to the aircraft, and they can protrude from the surrounding surface by ¼ inch to ½ inch, thus impacting the ability to implement them. Moreover, the use of add-on small, thin-film lithium batteries to harvest energy is also known. However, such small, thin-film lithium batteries can require increased maintenance.

Accordingly, there is a need in the art for an integrated thermoelectric composite structure and method that provides advantages over known devices and methods.

SUMMARY

This need for an integrated thermoelectric composite structure and method is satisfied. Unlike known devices and methods, embodiments of the structure and method may provide numerous advantages discussed below in the detailed description.

In an embodiment of the disclosure, there is provided a thermoelectric composite sandwich structure. The thermoelectric composite sandwich structure comprises two prepreg composite face sheets and an integrated honeycomb core assembled between the face sheets. The honeycomb core comprises a plurality of core elements bonded together with a core adhesive. Each core element has a first side substantially coated with a negative Seebeck coefficient conductive material having a plurality of first spaced gaps. Further, each core element has a second side substantially coated with a positive Seebeck coefficient conductive material having a plurality of second spaced gaps. The honeycomb core further comprises a plurality of electrical connections for connecting in series the coated first side to the coated second side. A temperature gradient across the honeycomb core generates power.

In another embodiment of the disclosure, there is provided a thermoelectric composite sandwich structure for use in aircraft and spacecraft. The thermoelectric composite sandwich structure comprises two prepreg composite face sheets and an integrated honeycomb core assembled between the face sheets. The honeycomb core comprises a plurality of core elements selected from the group comprising corrugated sheets and flat sheets, the core elements being bonded together with a core adhesive. Each core element has a first side substantially coated with a nickel layer having a plurality of first spaced gaps of a size in the range of from about 0.01 inch to about 0.15 inch and spaced at intervals from each other in a range of about 0.150 inch to about 0.55 inch. Each core element further has a second side substantially coated with an antimony layer having a plurality of second spaced gaps of a size in the range of from about 0.01 inch to about 0.15 inch and spaced at intervals from each other in a range of about 0.150 inch to about 0.55 inch. The honeycomb core further comprises a plurality of electrical connections for connecting in series the nickel layer to the antimony layer. A temperature gradient across the honeycomb core generates power.

In another embodiment of the disclosure, there is provided a method for making an integrated thermoelectric honeycomb core. The method comprises providing a corrugated core sheet. The method further comprises depositing a negative Seebeck coefficient conductive material with a plurality of first spaced gaps on a first side of the corrugated core sheet. The method further comprises depositing a positive Seebeck coefficient conductive material with a plurality of second spaced gaps on a second side of the corrugated core sheet. The method further comprises applying a core adhesive at intervals across a plurality of deposited corrugated core sheets. The method further comprises assembling and bonding the plurality of deposited corrugated core sheets to create an integrated thermoelectric honeycomb core. The method further comprises electrically connecting deposited negative Seebeck coefficient conductive material to deposited positive Seebeck coefficient conductive material in an alternating pattern along a length of the integrated thermoelectric honeycomb core.

In another embodiment of the disclosure, there is provided a method for making an integrated thermoelectric honeycomb core. The method comprises providing a flat core sheet. The method further comprises depositing a negative Seebeck coefficient conductive material with a plurality of first spaced gaps on a first side of the flat core sheet. The method further comprises depositing a positive Seebeck coefficient conductive material with a plurality of second spaced gaps on a second side of the flat core sheet. The method further comprises applying a core adhesive at intervals across a plurality of deposited flat core sheets. The method further comprises assembling and bonding the plurality of deposited flat core sheets. The method further comprises expanding the plurality of deposited flat core sheets to create an integrated thermoelectric honeycomb core. The method further comprises electrically connecting deposited negative Seebeck coefficient conductive material to deposited positive Seebeck coefficient conductive material in an alternating pattern along a length of the integrated thermoelectric honeycomb core.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 3A is an illustration of a side view of a first side of the integrated thermoelectric honeycomb core of the disclosure;

FIG. 3B is an illustration of a side view of a second side of the integrated thermoelectric honeycomb core of the disclosure;

FIG. 5A is an illustration of a flat core sheet used in forming one of the embodiments of the integrated thermoelectric honeycomb core of the disclosure;

FIG. 5B is an illustration of a coated first side of the flat core sheet of FIG. 5A;

FIG. 5C is an illustration of a coated first side and a coated second side of the flat core sheet of FIG. 5A;

FIG. 5D is an illustration of assembled deposited flat core sheets;

FIG. 5E is an illustration of an expanded integrated thermoelectric honeycomb core;

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art.

The disclosure provides for embodiments of an integrated thermoelectric composite sandwich structure having an integrated thermoelectric honeycomb core and a method for making the same. Embodiments of the structure and method may be used in aircraft, spacecraft, motorcraft, watercraft, and other craft, as well vehicles and structures. In addition, embodiments of the structure and method may be used with integrated commercial building materials for both cooling applications, as well as energy harvesting from lightweight structures.

Figure 1B:
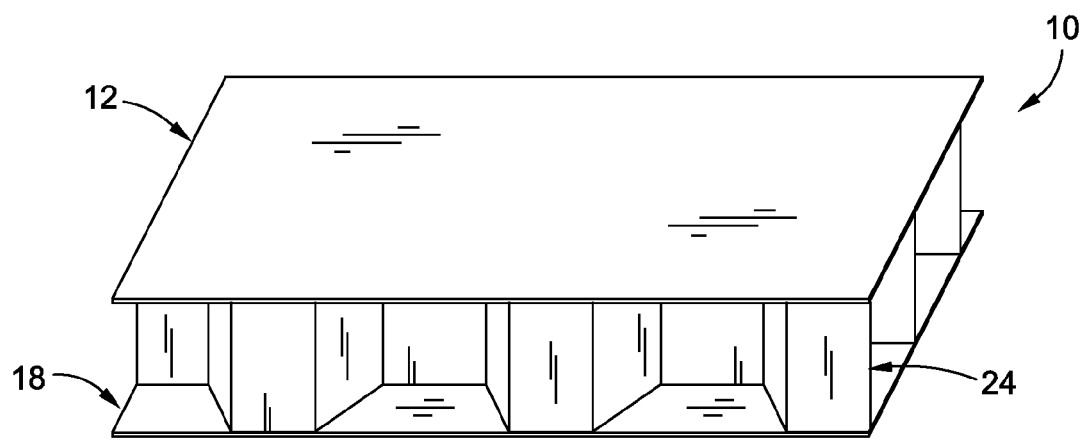
FIG. 1B is an illustration of a fully assembled perspective view of the thermoelectric composite sandwich structure of FIG. 1A.
Figure 1A:
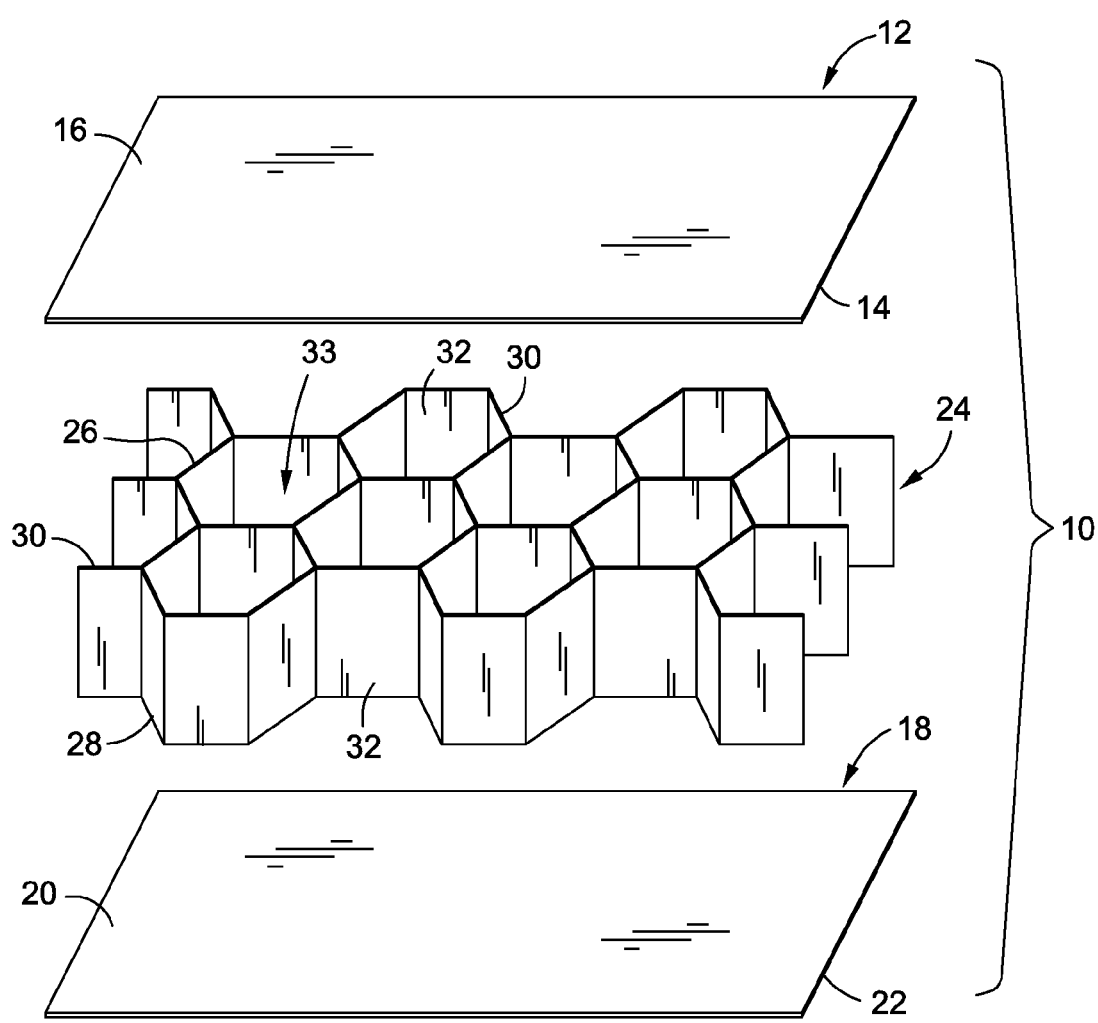
FIG. 1A is an illustration of an exploded perspective view of one of the embodiments of a thermoelectric composite sandwich structure of the disclosure.

FIG. 1A is an illustration of an exploded perspective view of one of the embodiments of an integrated thermoelectric composite sandwich structure 10 of the disclosure. FIG. 1B is an illustration of a fully assembled perspective view of the integrated thermoelectric composite sandwich structure 10 of FIG. 1A. In one of the embodiments of the disclosure, there is provided the integrated thermoelectric composite sandwich structure 10. The integrated thermoelectric composite sandwich structure 10 comprises a first face sheet 12 having an interior side 14 and an exterior side 16. The integrated thermoelectric composite sandwich structure 10 further comprises a second face sheet 18 having an interior side 20 and an exterior side 22. Preferably, the first face sheet 12 and the second face sheet 18 are comprised of a prepreg composite material. Suitable prepreg composite materials may comprise carbon fabric, fiberglass, quartz, aromatic aramid and polyamide preimpregnated with resin, or another suitable prepreg composite material. The first face sheet 12 and the second face sheet 18 may also be comprised of metal materials, such as aluminum or another suitable metal, plastic materials such as polyimide or another suitable plastic, or another suitable material. The thickness of the first and second face sheets 12, 18 may preferably be from about 0.005 inch to about 0.1 inch thick or of another suitable thickness. The integrated thermoelectric composite sandwich structure 10 further comprises an integrated thermoelectric honeycomb core 24 assembled between the first face sheet 12 and the second face sheet 18. The honeycomb core 24 has a first end 26 adjacent the interior side 14 of the first face sheet 12. The honeycomb core 24 has a second end 28 adjacent the interior side 20 of the second face sheet 19. The honeycomb core 24 has first sides 30 and second sides 32. The honeycomb core 24 may comprise cells 33 having a hexagonal shape. Hexagonal cells provide a minimum density for a given amount of material comprising the honeycomb core. Alternatively, the honeycomb core may comprise cells having another suitable shape.

Figure 2:
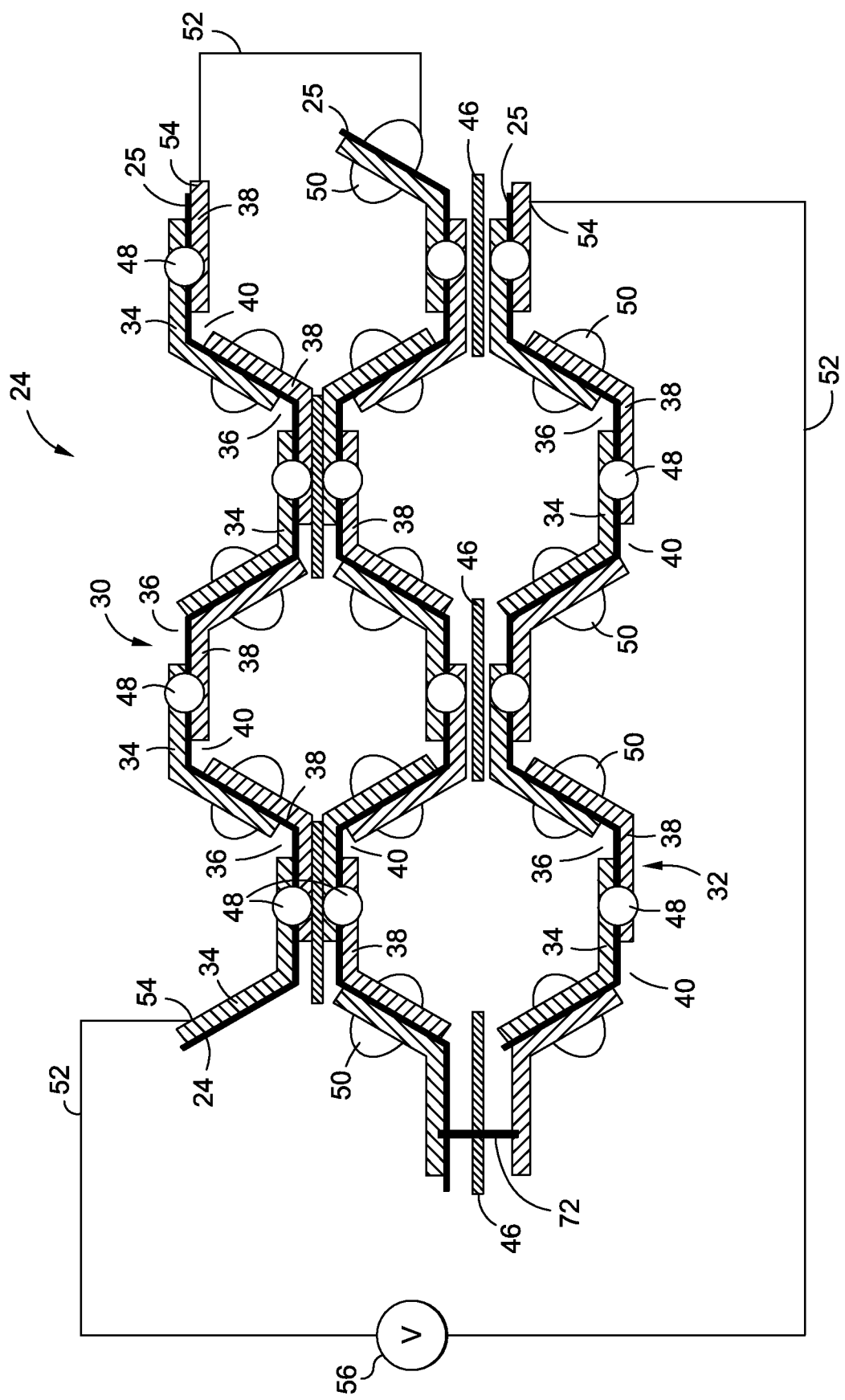
FIG. 2 is an illustration of a top view of one of the embodiments of the integrated thermoelectric honeycomb core of the disclosure.

FIG. 2 is an illustration of a top view of one of the embodiments of the integrated thermoelectric honeycomb core 24 of the disclosure. As shown in FIG. 2, the honeycomb core 24 comprises a plurality of core elements 25. In one embodiment the core element 25 may comprise a corrugated core sheet 64 (see FIG. 4A). In another embodiment the core element 25 may comprise a flat core sheet 70 (see FIG. 5A). However, other suitable core elements 25 may also be used. The core elements 25 may be made of fiberglass, plastic, paper, carbon or aramid fiber, reinforced preimpregnated resin coated sheets or paper, or another suitable material. The thickness of the core element 25 may preferably be from 0.3 inch to 2.0 inches thick or of another suitable thickness. The plurality of core elements 25 may preferably be bonded together with a core adhesive 46. The core adhesive 46 may comprise an epoxy, other similar resins, or another suitable adhesive. Each core element 25 has a first side 30 and a second side 32. Each first side 30 is substantially coated with a negative Seebeck coefficient conductive material 34. The negative Seebeck coefficient conductive material 34 preferably comprises nickel ($-15\,\mu V \cdot K^{-1}$), bismuth ($-72\,\mu V \cdot K^{-1}$), constantan ($-35\,\mu V \cdot K^{-1}$), potassium ($-9\,\mu V \cdot K^{-1}$), or another suitable negative Seebeck coefficient conductive material. More preferably, the negative Seebeck coefficient conductive material 34 is nickel. The conductive material may comprise foil or deposited metallic film layers deposited via thermal deposition, vapor deposition, chemical vapor deposition, plating, sputtering, or other suitable deposition processes, or the conductive material may comprise another suitable material. The thickness of the metallic film layer may be in the range of from about 0.05 mil thick to about 5.0 mil thick. The negative Seebeck coefficient conductive material 34 may be deposited onto the first side 30 via a suitable deposition process, such as thermal deposition, vapor deposition, chemical vapor deposition, plating, sputtering or other deposition processes. If the negative Seebeck coefficient conductive material 34 is deposited, the negative Seebeck coefficient conductive material 34 preferably has a plurality of first spaced gaps 36. The first spaced gaps 36 are preferably of a size in the range of from about 0.01 inch to about 0.15 inch and are preferably spaced at intervals from each other in a range of about 0.15 inch to about 0.55 inch. However, the first spaced gaps 36 may be of other suitable sizes and may be spaced apart from each other at other suitable intervals, depending on the size of the core element 25 used. If the negative Seebeck coefficient conductive material coating 34 is deposited as a contiguous sheet or applied as a contiguous foil layer, the first spaced gaps 36 may be precision machined into the metallic film layer by an etching process or another suitable removal process.

As shown in FIG. 2, each second side 32 of each core element 25 is substantially coated with a positive Seebeck coefficient conductive material 38. The positive Seebeck coefficient conductive material 38 preferably comprises antimony ($47\,\mu V \cdot K^{-1}$), iron ($19\,\mu V \cdot K^{-1}$), copper ($6.5\,\mu V \cdot K^{-1}$), silver ($6.5\,\mu V \cdot K^{-1}$), nichrome ($25\,\mu V \cdot K^{-1}$), or another suitable positive Seebeck coefficient conductive material. More preferably, the positive Seebeck coefficient conductive material 38 is antimony. The positive Seebeck coefficient conductive material 38 may be deposited onto the second side 32 via a suitable deposition process, such as thermal deposition, vapor deposition, chemical vapor deposition, plating, sputtering, or other deposition processes. If the positive Seebeck coefficient conductive material 38 is deposited, the positive Seebeck coefficient conductive material 38 preferably has a plurality of second spaced gaps 40. The second spaced gaps 40 are preferably of a size in the range of from about 0.01 inch to about 0.15 inch and are preferably spaced at intervals from each other in a range of about 0.15 inch to about 0.55 inch. However, the second spaced gaps 40 may be of other suitable sizes and may be spaced apart from each other at other suitable intervals, depending on the size of the core element 25 used. If the positive Seebeck coefficient conductive material 38 is deposited as a contiguous sheet or applied as a contiguous foil layer, the second spaced gaps 40 may be precision machined into the metallic film layer by an etching process or another suitable removal process.

The honeycomb core 24 may be constructed by depositing internally within the thermoelectric composite sandwich structure 10 and across the width of the honeycomb core 24 with alternating negative Seebeck coefficient conductive material 34 and positive Seebeck coefficient conductive material 38 connected in series, such that a temperature gradient across the honeycomb core 24 generates power. As shown in FIG. 2, the honeycomb core 24 further comprises a plurality of continuous electrical connections 48 and a plurality of discontinuous electrical connections 50 for connecting in series the first side 30 of each core element 25 to the second side 32 of each core element 25. Sections 54 of the honeycomb core 24 may be connected with a series style connection 52 having a voltage load 56. The alternating negative Seebeck coefficient conductive material 34, such as nickel, and the positive Seebeck coefficient conductive material 38, such as antimony, connected in series, create a plurality of nickel-antimony based thermopiles connected electrically in series and thermally in parallel. For purposes of this application, a thermopile means an electronic device that converts thermal energy into electrical energy, and it is composed of thermocouples connected in series or in parallel. Thermopiles do not measure the absolute temperature but generate an output voltage proportional to a local temperature difference or temperature gradient.

FIG. 3A is an illustration of a side view of first side 30 of the thermoelectric composite sandwich structure 10 of the disclosure. FIG. 3A shows the first side 30 of the honeycomb core 24 between the first face sheet 12 and the second face sheet 18. The first side 30 is substantially coated with the negative Seebeck coefficient conductive material 34 and preferably has the plurality of first spaced gaps 36 spaced at intervals along the first side 30. In this embodiment of the thermoelectric composite sandwich structure 10, portions 42 of the positive Seebeck coefficient conductive material 38 may be wrapped around from the second side 32 (see FIG. 3B) to the first side 30. Honeycomb core node lines 58 are shown and such node lines may comprises strips of adhesive that bond the corrugated core sheets 64 (see FIG. 4D) or the flat core sheets 70 (see FIG. 5E) together.

FIG. 3B is an illustration of a side view of second side 32 of the thermoelectric composite sandwich structure 10. FIG. 3B shows the second side 32 of the honeycomb core 24 between the first face sheet 12 and the second face sheet 18. The second side 32 is substantially coated with the positive Seebeck coefficient conductive material 38 and preferably has the plurality of second spaced gaps 40 spaced at intervals along the second side 32. In this embodiment of the thermoelectric composite sandwich structure 10, portions 44 of the negative Seebeck coefficient conductive material 36 may be wrapped around from the first side 30 (see FIG. 3A) to the second side 32. Honeycomb core node lines 58 are also present on the second side 32. A temperature gradient (ΔT) 60 (see FIG. 3A) across the honeycomb core 24 on the first side 30 generates power. A temperature gradient (ΔT) 62 (see FIG. 3B) across the honeycomb core 24 on the second side 32 also generates power. Preferably, 98% of the temperature gradient across the honeycomb core 24 generates power.

Fabrication of the integrated thermoelectric honeycomb core 24 may comprise several method embodiments. In one method, as shown in FIGS. 4A-4D and FIG. 6, the core element 25 comprises the corrugated core sheet 64. In another method, as shown in FIGS. 5A-5E and FIG. 7, the core element 25 comprises the flat core sheet 70. Other suitable methods of fabrication of the honeycomb core 24 using other suitable core elements 25 may also be used.

Figure 4A:
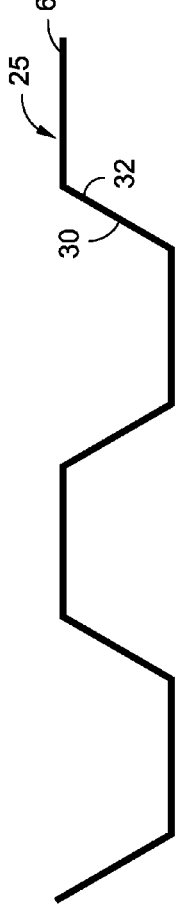
FIG. 4A is an illustration of a corrugated core sheet used in forming one of the embodiments of the integrated thermoelectric honeycomb core of the disclosure.
Figure 4B:
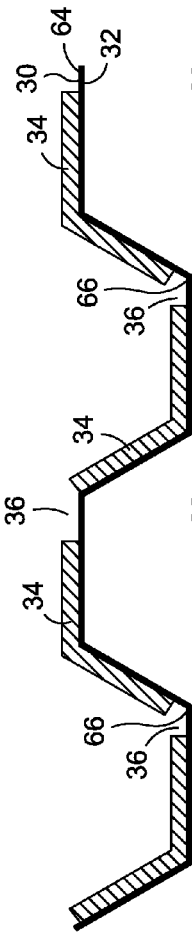
FIG. 4B is an illustration of a coated first side of the corrugated core sheet of FIG. 4A.
Figure 6:
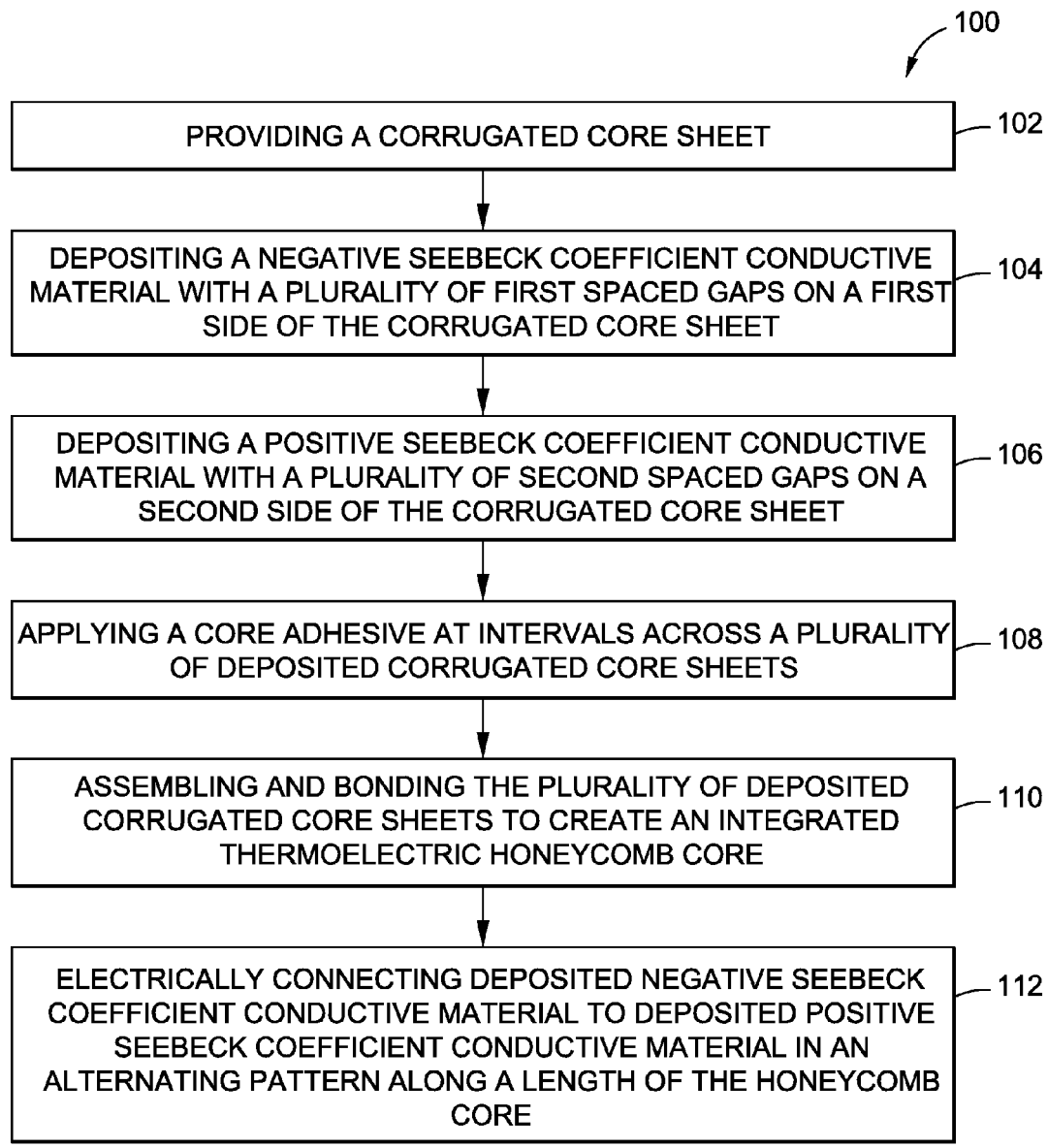
FIG. 6 is an illustration of a flow diagram of an embodiment of a method of the disclosure for making one of the embodiments of the integrated thermoelectric honeycomb core of the disclosure; and, FIG. 7 is an illustration of a flow diagram of another embodiment of a method of the disclosure for making one of the embodiments of the integrated thermoelectric honeycomb core of the disclosure.

FIG. 6 is an illustration of a flow diagram of an embodiment of a method 100 of the disclosure for making one of the embodiments of the integrated thermoelectric honeycomb core 24 of the disclosure using the corrugated core sheet 64. The method 100 comprises step 102 for providing a corrugated core sheet 64 (see FIG. 4A). FIG. 4A is an illustration of the corrugated core sheet 64 used in forming one of the embodiments of the integrated thermoelectric honeycomb core 24. The method 100 further comprises step 104 of depositing the negative Seebeck coefficient conductive material 34 (see FIG. 4B) with a plurality of first spaced gaps 36 on the first side 30 of the corrugated core sheet 64. FIG. 4B is an illustration of a coated first side 30 of the corrugated core sheet 64 of FIG. 4A. The negative Seebeck coefficient conductive material 34 preferably comprises nickel, bismuth, constantan, potassium, or another suitable negative Seebeck coefficient conductive material. More preferably, the negative Seebeck coefficient conductive material 34 comprises nickel. The conductive material is preferably foil or another suitable material. The negative Seebeck coefficient conductive material 34 may be deposited onto the first side 30 via a suitable deposition process, such as thermal deposition, vapor deposition, chemical vapor deposition, plating, sputtering, or other deposition processes. The first spaced gaps 36 may comprise patterned break points around alternating edges 66 on the first side 30 of the corrugated core sheet 64. The first spaced gaps 36 are preferably of a size in the range of from about 0.01 inch to about 0.15 inch and are preferably spaced at intervals from each other in a range of about 0.15 inch to about 0.55 inch. However, the first spaced gaps 36 may be of other suitable sizes and may be spaced apart from each other at other suitable intervals, depending on the size of the corrugated core sheet 64 used.

Figure 4C:
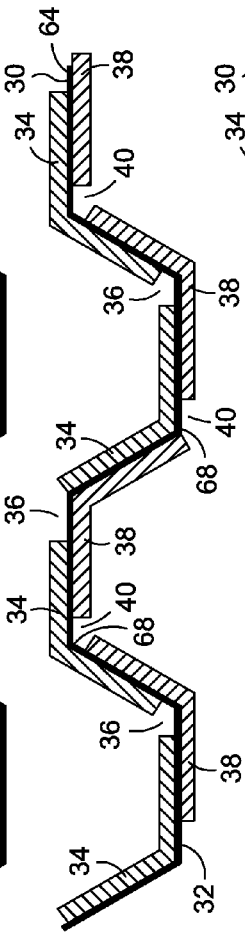
FIG. 4C is an illustration of a coated first side and a coated second side of the corrugated core sheet of FIG. 4A.

The method 100 further comprises step 106 of depositing the positive Seebeck coefficient conductive material 38 with a plurality of second spaced gaps 40 on the second side 32 of the corrugated core sheet 64 (see FIG. 4C). FIG. 4C is an illustration of a coated first side 30 and a coated second side 32 of the corrugated core sheet 64 of FIG. 4A. The positive Seebeck coefficient conductive material 38 preferably comprises antimony, iron, a mixture of copper and silver, nichrome, or another suitable positive Seebeck coefficient conductive material. More preferably, the positive Seebeck coefficient conductive material 38 comprises antimony. The conductive material may comprise foil or deposited metallic film layers deposited via thermal deposition, vapor deposition, chemical vapor deposition, plating, sputtering, or other suitable deposition processes, or the conductive material may comprise another suitable material. The positive Seebeck coefficient conductive material 38 may be deposited onto the second side 32 via a suitable deposition process, such as thermal deposition, vapor deposition, chemical vapor deposition, plating, sputtering, or other deposition processes. The second spaced gaps 40 may comprise patterned break points around alternating edges 68 on the second side 32 of the corrugated core sheet 64. The second spaced gaps 40 are preferably of a size in the range of from about 0.01 inch to about 0.15 inch and are preferably spaced at intervals from each other in a range of about 0.15 inch to about 0.55 inch. However, the second spaced gaps 40 may be of other suitable sizes and may be spaced apart from each other at other suitable intervals, depending on the size of the corrugated core sheet 64 used.

Figure 4D:
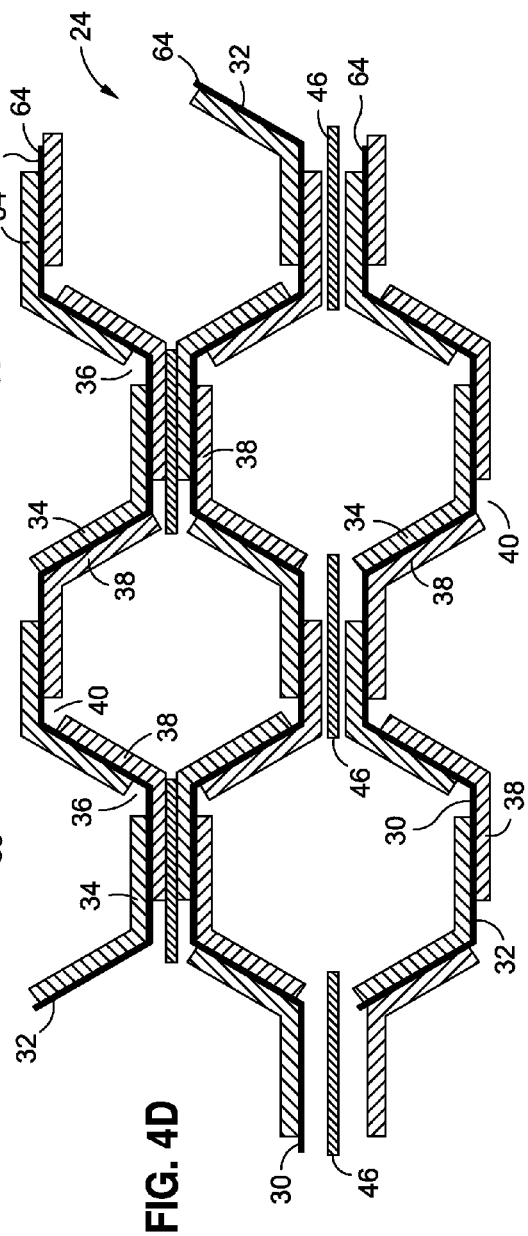
FIG. 4D is an illustration of an assembled integrated thermoelectric honeycomb core.

The method 100 further comprises step 108 of applying a core adhesive 46 (see FIG. 4D) at intervals across a plurality of deposited corrugated core sheets 64. The core adhesive 46 may comprise an epoxy, other similar resins, or another suitable adhesive. The method 100 further comprises step 110 of assembling and bonding the plurality of deposited corrugated core sheets 64 to create the integrated thermoelectric honeycomb core 24. FIG. 4D is an illustration of the assembled thermoelectric honeycomb core 24. The method 100 further comprises step 112 of electrically connecting with continuous electrical connections 48 (see FIG. 2) and discontinuous electrical connections 50 (see FIG. 2) the deposited negative Seebeck coefficient conductive material 34 to the deposited positive Seebeck coefficient conductive material 38 in an alternating pattern along a length of the integrated thermoelectric honeycomb core. Sections 54 of the integrated thermoelectric honeycomb core 24 may be connected with a series style connection 52 having a voltage load 56 (see FIG. 2). The electrically connecting step 112 of electrically connecting the deposited negative Seebeck coefficient conductive material to the deposited positive Seebeck coefficient conductive material may also be performed prior to both the applying of the core adhesive step 108 and the assembling and bonding of the plurality of deposited corrugated core sheets step 110.

Figure 7:
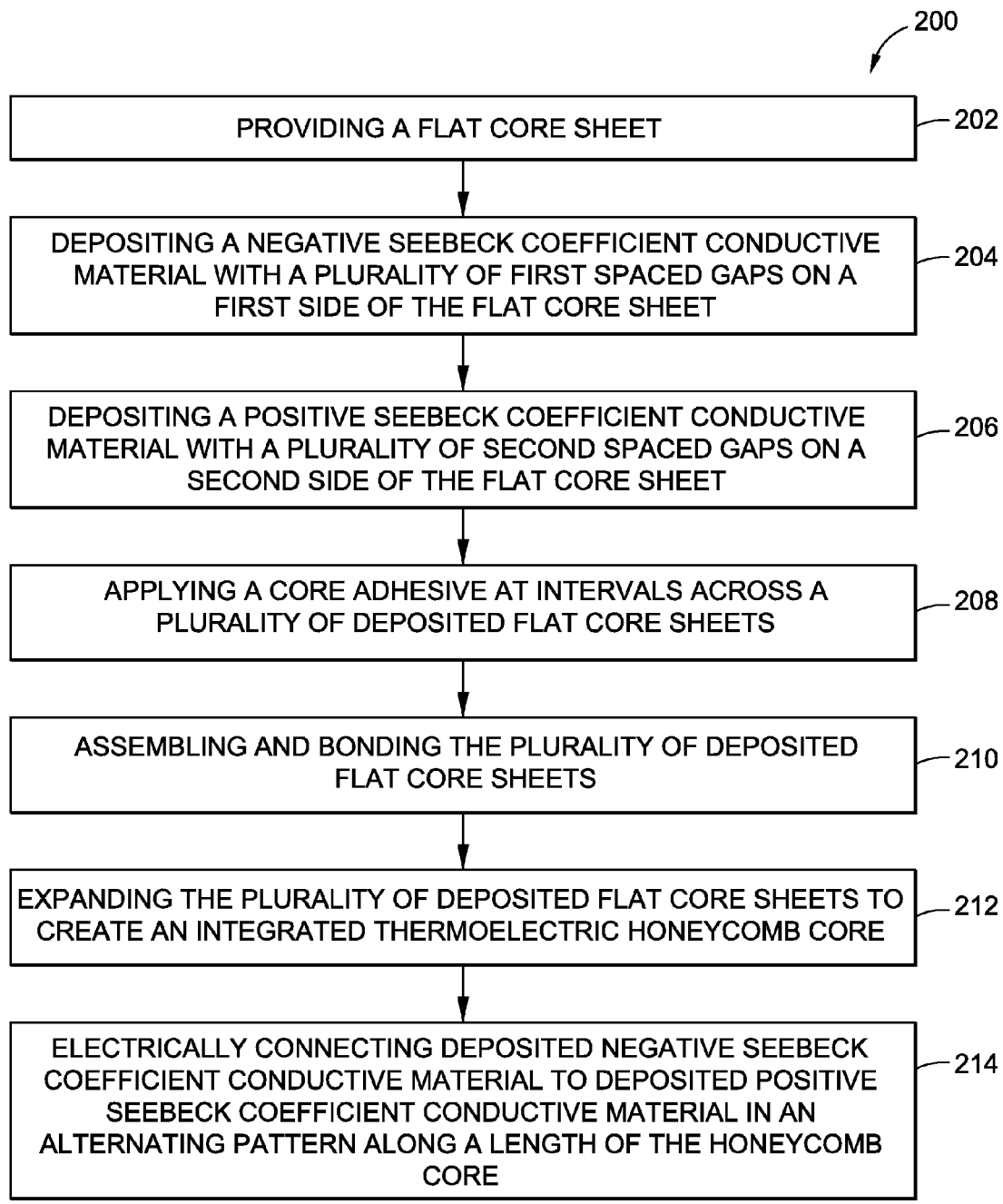

FIG. 7 is an illustration of a flow diagram of another embodiment of a method 200 of the disclosure for making one of the embodiments of the integrated thermoelectric honeycomb core 24 of the disclosure using the flat core sheet 70. The method 200 comprises step 202 of providing the flat core sheet 70 (see FIG. 5A). FIG. 5A is an illustration of the flat core sheet 70 used in forming one of the embodiments of the integrated thermoelectric honeycomb core 24. The method 200 further comprises step 204 of depositing negative Seebeck coefficient conductive material 34 with a plurality of first spaced gaps 36 on the first side 30 of the flat core sheet 70. FIG. 5B is an illustration of a coated first side of the flat core sheet 70 of FIG. 5A. The negative Seebeck coefficient conductive material 34 preferably comprises nickel, bismuth, constantan, potassium, or another suitable negative Seebeck coefficient conductive material. Preferably, the negative Seebeck coefficient conductive material 34 comprises nickel. The conductive material may comprise foil or deposited metallic film layers deposited via thermal deposition, vapor deposition, chemical vapor deposition, plating, sputtering, or other suitable deposition processes, or the conductive material may comprise another suitable material. The deposition process may comprise a suitable deposition process such as thermal deposition, vapor deposition, chemical vapor deposition, plating, sputtering, or other deposition processes. The first spaced gaps 36 are preferably of a size in the range of from about 0.01 inch to about 0.15 inch and are preferably spaced at intervals from each other in a range of about 0.15 inch to about 0.55 inch. However, the first spaced gaps 36 may be of other suitable sizes and may be spaced apart from each other at other suitable intervals, depending on the size of the flat core sheet 70 used.

The method 200 further comprises step 206 of depositing positive Seebeck coefficient conductive material 38 with a plurality of second spaced gaps 40 on second side 32 of the flat core sheet 70. FIG. 5C is an illustration of coated first side 30 and coated second side 32 of the flat core sheet 70 of FIG. 5A. The positive Seebeck coefficient conductive material 38 preferably comprises antimony, iron, a mixture of copper and silver, nichrome, or another suitable positive Seebeck coefficient conductive material. More preferably, the positive Seebeck coefficient conductive material 38 comprises antimony. The conductive material is preferably foil or another suitable material. The deposition process may comprise a suitable deposition process such as thermal deposition, vapor deposition, chemical vapor deposition, plating, or another deposition process. The second spaced gaps 40 are preferably of a size in the range of from about 0.01 inch to about 0.15 inch and are preferably spaced at intervals from each other in a range of about 0.15 inch to about 0.55 inch. However, the second spaced gaps 40 may be of other suitable sizes and may be spaced apart from each other at other suitable intervals, depending on the size of the flat core sheet 70 used.

The method 200 further comprises step 208 of applying core adhesive 46 at intervals across a plurality of deposited flat core sheets 70. The core adhesive 46 may comprise an epoxy, other similar resins, or another suitable adhesive. The method 200 further comprises step 210 of assembling and bonding the plurality of deposited flat core sheets 70. FIG. 5D is an illustration of the assembled flat core sheets 70 of the integrated thermoelectric honeycomb core 24. The method 200 further comprises step 212 of expanding the plurality of deposited flat core sheets 70 to create the integrated thermoelectric honeycomb core 24. FIG. 5E is an illustration of the expanded integrated thermoelectric honeycomb core 24. The method 200 further comprises step 214 of electrically connecting with continuous electrical connections 48 (see FIG. 2) and discontinuous electrical connections 50 (see FIG. 2) the deposited negative Seebeck coefficient conductive material 34 to the deposited positive Seebeck coefficient conductive material 38 in an alternating pattern along a length of the integrated thermoelectric honeycomb core. Sections 54 of the integrated thermoelectric honeycomb core 24 may be connected with a series style connection 52 having a voltage load 56 (see FIG. 2). The electrically connecting step 214 of electrically connecting the deposited negative Seebeck coefficient conductive material to the deposited positive Seebeck coefficient conductive material may also be performed prior to both the applying of the core adhesive step 208 and the assembling and bonding of the plurality of deposited flat core sheets step 210. In addition, the electrical connections may be made at the individual flat core sheet 70 level or once the integrated thermoelectric honeycomb core 24 has been expanded. One or more end electrical connections 72 (see FIG. 2) may be made prior to the expanding step 212 if desired. The end electrical connections 72 preferably connect one or more negative Seebeck coefficient conductive materials 34 to one or more positive Seebeck coefficient conductive materials 38. The end electrical connections 72 may be soldered, tack welded, bonded with a conductive adhesive such as epoxy, or connected in another suitable manner to the one or more negative Seebeck coefficient conductive materials 34 and to the one or more positive Seebeck coefficient conductive materials 38.

The embodiments of the thermoelectric composite sandwich structure 10 with the integrated thermoelectric honeycomb core 24 and embodiments of the method for making the same have numerous advantages. The thermoelectric composite sandwich structure 10 fully integrates thermoelectric elements (i.e., the deposited negative Seebeck coefficient conductive material and the deposited positive Seebeck coefficient conductive material) within a non-metallic cellular honeycomb core formed in a sandwich structure to generate energy. The integrated thermoelectric honeycomb core 24 disclosed herein can internally generate power without moving parts and without maintenance for embedded sensors. Embodiments of the structure and method disclosed herein enable fully embedded structural health monitoring (SHM), as the power or energy can be generated, sensors can be used, and the signals can be transmitted all from within the honeycomb core internal power source, thus minimizing punctures or holes in the first and second face sheets 12, 18. By generating power with the honeycomb core structure, embodiments of the structure and method disclosed herein can enable structural health monitoring (SHM) of joints, data collection and transmission units, bonded structure, and assessment of core health, and can lead to the implementation of fully bonded structure, fly-by-feel technologies, on-board wireless communication of controls, damage tolerant structures, and redundant power supplies for additional sources of power on an aircraft, spacecraft, or other craft.

Further advantages of embodiments of the structure and method disclosed herein include decreased costs or cost avoidance for power generation for structural health monitoring (SHM) type applications, reduced damage impact, reduced inspection cycles, lower installation costs of remote hardware, and decreased weight and complexity by not having to power remote sensors and use additional communication wires. In addition, embodiments of the structure and method disclosed herein provide for generation of power from structural components which are exposed to thermal gradients, and may provide more than a few hundred watts of power from large areas exposed to appropriate temperature gradients. Use of embodiments of the structure and method disclosed herein with structures used in space creates a natural thermal gradient across the honeycomb core structure and can be used as a means of generating power without having to use solar arrays. Further, embodiments of the structure and method disclosed herein may be used to cool the face sheets 12, 18, enabling the integrated thermoelectric structure to provide for environmental control. In other applications, embodiments of the structure and method disclosed herein can be used to power satellites and other spacecraft.

The integrated thermoelectric honeycomb core structure incorporates a plurality of thermopiles in series which are supported on either side of the honeycomb core between the composite sandwich face sheets 12, 18. By using metallic coatings with extreme Seebeck coefficients to overcome the electrical loss concerns, taking advantage of the increased area provided through the fully integrated honeycomb core structure, and the limited weight gains induced by the large area, embodiments of a method to internally generate power within structural material may be obtained. In space, the thermal gradient of the structure disclosed herein can also be used to harness thermal gradients generated from solar flux, perhaps even from the structural supports for solar cells. In 0.6 inch thick core structures radiating into space, with 1.0 sun flux (approximately 1.4 kW·m$^{-2}$ (kilo-watt meter)), the first and second face sheet 12, 18 temperatures rise to 242.2° F., whereas the shielded side of the honeycomb core remains at approximate 40° F., creating a 200° F. ΔT (temperature gradient or drop) across the honeycomb core. This can be directly harvested with embodiments of the structure and method disclosed herein for additional energy harvesting from the structural elements.

Ninety-eight percent (98%) of the thermal gradient across the integrated thermoelectric honeycomb core structure may be harvested for power generation using the integrated thermoelectric composite sandwich structure disclosed herein, whereas only 1% to 2% of the thermal gradient may be used in known non-integrated or add-on devices. Even if the efficiencies of the integrated thermoelectric composite sandwich structure are one quarter of known devices, they are approximately twenty-five (25) times more efficient at harvesting energy from the temperature gradient present across the honeycomb core structure. For example, using an integrated approach, for one (1) ounce of material, 0.5 watts can be generated with a ΔT (temperature gradient) of 250° F. (Fahrenheit). Using known devices, however, the same amount of power can require approximately 25 ounces of additional material, which is not practical for such a small amount of power. At the crux of the disclosed embodiments are a number of nickel-antimony based thermopiles, connected electrically in series and thermally in parallel. Each thermopile can generate a voltage of 50-60 μV·K$^{-1}$ (microvolt per degree Kelvin). At typical temperature gradients seen on board aircraft and air vehicles, this can amount to approximately 7.5 mV to 10 mV (millivolt) per thermopile. Connecting one hundred fifty (150) in series provides an approximately 1.5V (volt) potential. Assuming a core thickness of approximately 0.6 inch (typical in engine cowlings), a 2 mil thick foil (or plating) for both metals, with 0.5 inch wide thermopile, approximately upwards of 1.0 amp (ampere) of current can be produced. A one square foot structure of 150 thermopiles can generate approximately 1.0 amp at 1 volt. This can require one (1) additional ounce of material (the mass of metal), and can be more than sufficient to power a large embedded sensor array for use in structural health monitoring (SHM). Reduction of the size of materials in all dimensions may be possible through optimization for various applications. Calculations have been performed to assess feasibility of the disclosed embodiments herein and potential efficiencies. Embodiments of the structure disclosed herein can provide approximately 25 W·lbs$^{-1}$ (watt pounds) with known materials, and refinements of embodiments of the structure and optimization of the materials disclosed herein may provide upwards of 100 W·lbs$^{-1}$. In some applications with the integrated thermoelectric honeycomb core structure disclosed herein, the available ΔT is much smaller at one face sheet (only 1% of the ΔT), so in such applications, the integrated approach is approximately 25 times more efficient than known non-integrated approaches.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. A thermoelectric composite sandwich structure comprising:
   two prepreg composite face sheets;
   an integrated honeycomb core assembled between the face sheets, the honeycomb core comprising:
      a plurality of core elements comprising corrugated core sheets, the core elements bonded together with a core adhesive applied at intervals across a plurality of deposited core elements;
      each core element having a first side substantially coated with a negative Seebeck coefficient conductive material having a plurality of first spaced gaps;
      each core element having a second side substantially coated with a positive Seebeck coefficient conductive material having a plurality of second spaced gaps, wherein the first spaced gaps on the first side of the core element do not overlap with the second spaced gaps on the second side of the core element; and,
   a plurality of electrical connections for connecting in series the coated first side to the coated second side;
   wherein the first side of each of the plurality of deposited core elements faces the second side of each adjacent core element of the plurality of deposited core elements to form a honeycomb shape when assembled, and the positive Seebeck coefficient conductive material and the negative Seebeck coefficient conductive material alternate on opposing first and second sides of the plurality of deposited core elements, and further wherein the deposited negative Seebeck coefficient conductive material is electrically connected to the deposited positive Seebeck coefficient conductive material in an alternating pattern along a length of the first and second sides of the integrated honeycomb core, and the conductive material is foil or deposited metallic film layers.

2. The structure of claim 1 wherein the negative Seebeck coefficient conductive material is selected from the group comprising nickel, bismuth, constantan, and potassium.

3. The structure of claim 2 wherein the negative Seebeck coefficient conductive material is nickel.

4. The structure of claim 1 wherein the positive Seebeck coefficient conductive material is selected from the group comprising antimony, iron, a mixture of copper and silver, and nichrome.

5. The structure of claim 4 wherein the positive Seebeck coefficient conductive material is antimony.

6. The structure of claim 1 wherein the thermoelectric composite sandwich structure is a bonded structure on an aircraft or a spacecraft.

7. The structure of claim 1 wherein the first spaced gaps are of a size in the range of from about 0.01 inch to about 0.15 inch and are spaced at intervals from each other in a range of about 0.15 inch to about 0.55 inch.

8. The structure of claim 1 wherein the second spaced gaps are of a size in the range of from about 0.01 inch to about 0.15 inch and are spaced at intervals from each other in a range of about 0.15 inch to about 0.55 inch.

9. The structure of claim 1 wherein a temperature gradient across the honeycomb core generates power.

10. The structure of claim 1 wherein the corrugated core sheets are substituted with flat core sheets.

11. A thermoelectric composite sandwich structure for use in aircraft and spacecraft comprising:
two prepreg composite face sheets;
an integrated honeycomb core assembled between the face sheets, the honeycomb core comprising:
a plurality of core elements comprising corrugated core sheets or flat core sheets, the core elements coupled together with a core adhesive applied at intervals across a plurality of deposited core elements;
each core element having a first side substantially coated with a negative Seebeck coefficient conductive material having a plurality of first spaced gaps;
each core element having a second side substantially coated with positive Seebeck coefficient conductive material having a plurality of second spaced gaps wherein the first spaced gaps on the first side of the core element do not overlap with the second spaced gaps on the second side of the core element; and,
a plurality of electrical connections for connecting in series the the coated first side to the coated second side;
wherein the first side of each of the plurality of deposited core elements faces the second side of each adjacent core element of the plurality of deposited core elements to form a honeycomb shape when assembled, and the positive Seebeck coefficient conductive material and the negative Seebeck coefficient conductive material alternate on opposing first and second sides of the plurality of deposited core elements, and further wherein the deposited negative Seebeck coefficient conductive material is electrically connected to the deposited positive Seebeck coefficient conductive material in an alternating pattern along a length of the first and second sides of the integrated honeycomb core, and the conductive material is foil or deposited metallic film layers.

12. The structure of claim 11 wherein a temperature gradient across the honeycomb core generates power.

13. An integrated thermoelectric honeycomb core comprising:
a corrugated core sheet with a first face and a second face, the first and second faces comprising opposing sides of the corrugated core sheet;
a negative Seebeck coefficient conductive material with a plurality of first spaced gaps on the first face of the corrugated core sheet;
a positive Seebeck coefficient conductive material with a plurality of second spaced gaps on the second face of the corrugated core sheet, wherein the first spaced gaps on the first face of the corrugated core sheet do not overlap with the second spaced gaps on the second face of the corrugated core sheet; and,
a core adhesive applied at intervals across a plurality of deposited corrugated core sheets;
wherein the first face of each of the plurality of deposited corrugated core sheets faces the second face of each adjacent corrugated core sheet of the plurality of deposited corrugated core sheets to form a honeycomb shape when assembled, and the positive Seebeck coefficient conductive material and the negative Seebeck coefficient conductive material alternate on the opposing sides of the plurality of deposited corrugated core sheets, and further wherein the deposited negative Seebeck coefficient conductive material is electrically connected to the deposited positive Seebeck coefficient conductive material in an alternating pattern along a length of the first and second faces of the integrated thermoelectric honeycomb core, and the conductive material is foil or deposited metallic film layers.

14. The integrated thermoelectric honeycomb core of claim 13 wherein the first spaced gaps and the second spaced gaps are of a size in the range of from about 0.01 inch to about 0.15 inch and are spaced at respective intervals from each other in a range of about 0.15 inch to about 0.55 inch.

15. The integrated thermoelectric honeycomb core of claim 13 wherein the negative Seebeck coefficient conductive material is selected from the group comprising nickel, bismuth, constantan, and potassium.

16. The integrated thermoelectric honeycomb core of claim 13 wherein the positive Seebeck coefficient conductive material is selected from the group comprising antimony, iron, a mixture of copper and silver, and nichrome.

17. The integrated thermoelectric honeycomb core of claim 13 wherein the corrugated core sheets are substituted with flat core sheets.

18. The integrated thermoelectric honeycomb core of claim 13 wherein the integrated thermoelectric honeycomb core is a bonded structure on an aircraft or a spacecraft.

19. The integrated thermoelectric honeycomb core of claim 13 wherein the integrated thermoelectric honeycomb core has a temperature gradient across the integrated thermoelectric honeycomb core that generates power.

20. The integrated thermoelectric honeycomb core of claim 19 wherein 98% of the temperature gradient across the integrated thermoelectric honeycomb core generates power.

* * * * *